US007733646B2

(12) United States Patent
Hisatsune

(10) Patent No.: US 7,733,646 B2
(45) Date of Patent: Jun. 8, 2010

(54) FRONTAL STRUCTURE OF INFORMATION PROCESSING APPARATUS

(75) Inventor: Toshiyuki Hisatsune, Kanagawa (JP)

(73) Assignee: Sony Corporation, Tokyo (JP)

( * ) Notice: Subject to any disclaimer, the term of this patent is extended or adjusted under 35 U.S.C. 154(b) by 118 days.

(21) Appl. No.: 12/034,957

(22) Filed: Feb. 21, 2008

(65) Prior Publication Data

US 2008/0253068 A1 Oct. 16, 2008

(30) Foreign Application Priority Data

Apr. 13, 2007 (JP) ............................. 2007-106257

(51) Int. Cl.
  *H05K 7/20* (2006.01)
(52) U.S. Cl. ............. 361/690; 361/679.02; 361/679.22; 361/818; 174/383; 312/223.2; 312/223.3
(58) Field of Classification Search ............ 361/679.46, 361/679.47, 679.48, 679.49, 679.5, 688, 361/690–697, 722–727, 816, 818, 831; 312/223.1, 312/223.2, 223.3, 293.1, 293.2, 293.3, 334.1, 312/334.8, 334.23, 349, 350; 454/184; 165/121–126, 165/104.33, 185; 174/50, 350, 377, 383, 174/390, 360, 382, 385, 52.4, 35 MS, 35 GS
See application file for complete search history.

(56) References Cited

U.S. PATENT DOCUMENTS

| 3,546,359 | A | * | 12/1970 | Kaufman et al. ............. 174/383 |
| 5,519,572 | A | * | 5/1996 | Luo ....................... 361/679.23 |
| 5,912,799 | A | * | 6/1999 | Grouell et al. .......... 361/679.32 |
| 6,018,125 | A | * | 1/2000 | Collins et al. ............... 174/383 |
| 6,252,161 | B1 | * | 6/2001 | Hailey et al. ................ 174/383 |
| 6,297,446 | B1 | * | 10/2001 | Cherniski et al. ........... 174/383 |
| 6,362,417 | B2 | * | 3/2002 | Mitchell et al. ............. 174/384 |
| 6,396,684 | B2 | * | 5/2002 | Lee ........................ 361/679.49 |
| 6,426,459 | B1 | * | 7/2002 | Mitchell ..................... 174/382 |
| 6,542,362 | B2 | * | 4/2003 | Lajara et al. ........... 361/679.48 |
| 6,554,697 | B1 | * | 4/2003 | Koplin ........................ 454/184 |
| 6,610,922 | B1 | * | 8/2003 | Twiss et al. .................. 174/390 |
| 6,680,847 | B2 | * | 1/2004 | Heard ......................... 361/692 |
| 6,731,499 | B2 | * | 5/2004 | Jeng ...................... 361/679.22 |
| 6,838,613 | B2 | * | 1/2005 | Kopf ........................... 174/383 |
| 6,870,092 | B2 | * | 3/2005 | Lambert et al. ............. 174/355 |
| 6,919,816 | B2 | * | 7/2005 | Dearborn et al. ....... 340/815.45 |
| 6,947,294 | B2 | * | 9/2005 | Lin et al. ..................... 361/818 |
| 7,173,822 | B2 | * | 2/2007 | Liang et al. ................. 361/695 |

(Continued)

FOREIGN PATENT DOCUMENTS

DE 20216538 U1 * 1/2003

(Continued)

*Primary Examiner*—Michael V Datskovskiy
(74) *Attorney, Agent, or Firm*—Oblon, Spivak, McClelland, Maier & Neustadt, L.L.P.

(57) ABSTRACT

A frontal structure of an information processing apparatus, includes a plurality plate-like members, each member having a plurality of perforations opened at predetermined intervals therebetween, each perforation having a predetermined size and shape, and a light-emitting unit for emitting light toward the plate-like members. The plate-like members run in parallel and are arranged with one behind another and an entire or part of frontmost one of the plate-like members serves as an entire or part of front of a casing of the information processing apparatus.

11 Claims, 15 Drawing Sheets

U.S. PATENT DOCUMENTS

| | | | |
|---|---|---|---|
| 7,443,688 B2 * | 10/2008 | Chen et al. | 361/726 |
| 7,450,377 B2 * | 11/2008 | Matsumoto et al. | 361/679.48 |
| 7,492,610 B2 * | 2/2009 | Gilliland | 361/818 |
| 7,522,414 B2 * | 4/2009 | Karstens | 361/690 |
| 7,589,978 B1 * | 9/2009 | Holdredge et al. | 361/818 |
| 2005/0013751 A1 * | 1/2005 | Huang et al. | 422/186.3 |
| 2005/0053468 A1 * | 3/2005 | Kuan | 417/32 |

FOREIGN PATENT DOCUMENTS

| | | |
|---|---|---|
| JP | 59-92927 | 6/1984 |
| JP | 10-270879 | 10/1998 |
| JP | 2002-223091 | 8/2002 |
| JP | 2005-166732 | 6/2005 |
| JP | 2005-222584 | 8/2005 |
| JP | 2006-239176 A | 9/2006 |
| JP | 2007-27319 | 2/2007 |

* cited by examiner

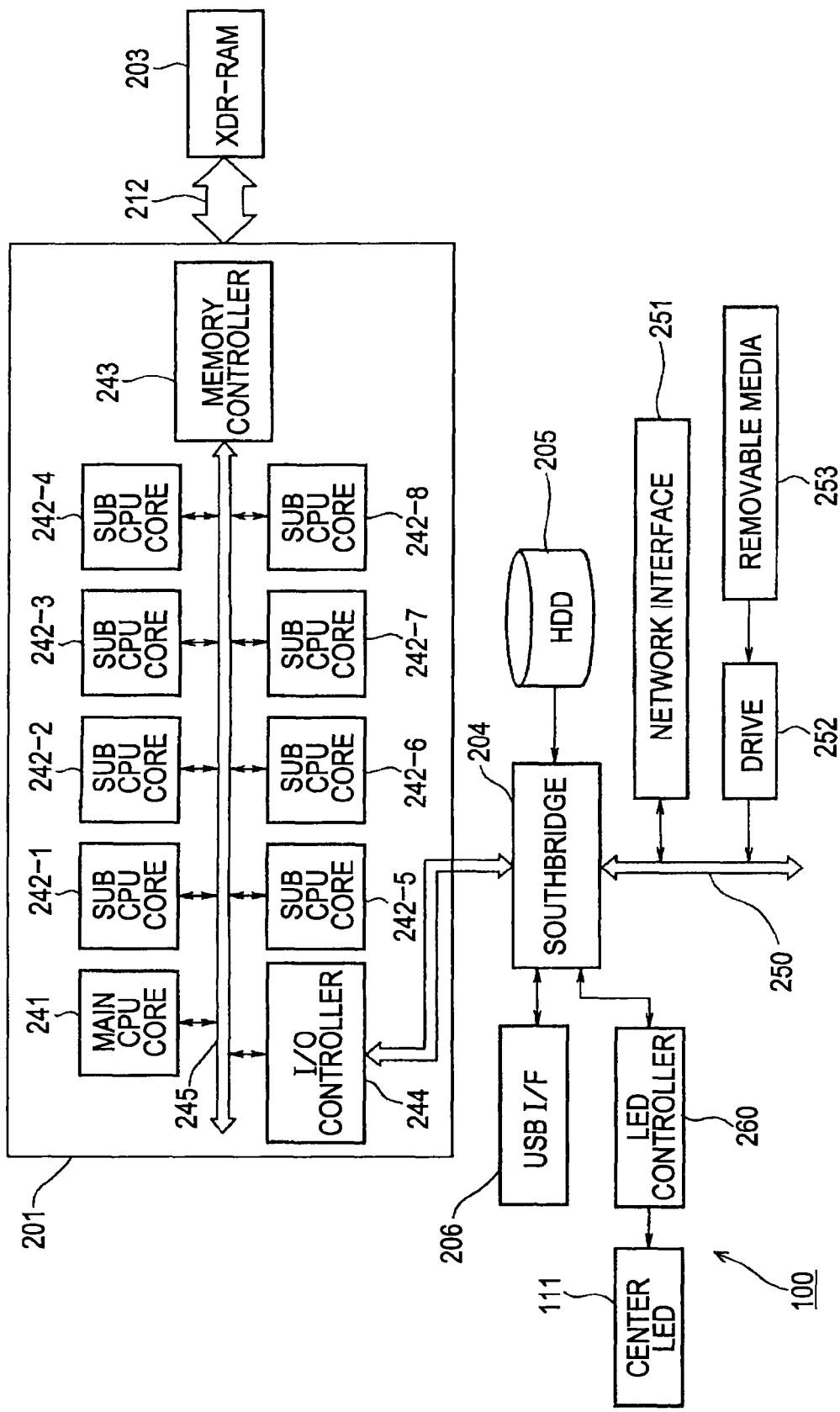

FRONTAL STRUCTURE OF INFORMATION PROCESSING APPARATUS

CROSS REFERENCES TO RELATED APPLICATIONS

The present invention contains subject matter related to Japanese Patent Application No. JP 2007-106257 filed in the Japanese Patent Office on Apr. 13, 2007, the entire contents of which are incorporated herein by reference.

BACKGROUND OF THE INVENTION

1. Field of the Invention

The present invention relates to a frontal structure of an information processing apparatus for improving an aperture ratio of a casing of the information processing apparatus without reducing design value of a front of the casing of the information processing apparatus.

2. Description of the Related Art

A variety of methods have been proposed to dissipate heat from heat generators including a central processing unit (CPU), a graphics processing unit (GPU) or a power supply used in an information processing apparatus. For example, in one method, a heat sink made of a metal such as aluminum having a high thermal conductivity and having a broad surface area is placed into contact with the heat generator to dissipate heat generated by the heat generator to the ambient air. In another method, an electric fan is used to force air heated within the interior of the casing of the information processing apparatus out of the casing (as disclosed in Japanese Unexamined Patent Application Publication No. 2005-222584).

As performance of information processing apparatuses is currently enhanced, the amount of heat generated by the heat generator is increased. Heat dissipation technique becomes more important and the need for efficient heat dissipation method is mounting.

From the viewpoint of design and convenience, the power supply is typically arranged on the back of the casing of the information processing apparatus. Because of this structure, heat tends to build up on the rear side within the interior of the casing of the information processing apparatus. It is thus preferable to discharge air through the rear panel of the casing. If an electric fan is used to force air out from inside the casing, the electric fan is preferably mounted on the rear side of the casing to provide low noise environment.

When air is discharged through the rear side of the casing, an air intake vent is preferably mounted on the front side of the casing for air ventilation. With the information processing apparatus becoming advanced in performance, a larger amount of air needs to be ventilated per unit time. To this end, a larger air intake vent is preferable (for a higher aperture ratio).

To improve a heat dissipation rate, the air intake vent is preferably mounted on the front panel and the aperture ratio of the front panel of the casing is preferably increased.

SUMMARY OF THE INVENTION

The front side of the casing is likely to fall within the user's view field and is frequently provided with a user interface. The design consideration on the front side of the casing has more importance than on the other portion of the apparatus. If a large air intake vent is arranged on the front side to increase the aperture ratio, electric circuitry such as a printed circuit board and the like is exposed to the user's view. Such an arrangement is not preferable from design consideration.

It is thus desirable to improve the aperture ratio of the front side of the casing without lowering design value.

In accordance with one embodiment of the present invention, a frontal structure of an information processing apparatus, includes a plurality plate-like members, each member having a plurality of perforations opened at predetermined intervals therebetween, each perforation having a predetermined size and shape and a light-emitting unit for emitting light toward the plurality of plate-like members the plate-like members. The plate-like members run in parallel and are arranged with one behind another and an entire or part of frontmost one of the plate-like members serves as an entire or part of front of a casing of the information processing apparatus.

Each of the perforation preferably serves as an air intake vent for taking air from outside the information processing apparatus into an interior of the casing of the information processing apparatus.

Each of the perforations preferably has a generally hexagonal shape in a manner such that the perforations form a honeycomb structure.

The plurality of plate-like members may be arranged so that each perforation on one of the plate-like members is in alignment with a corresponding perforation on another of the plate-like member.

Each of the plurality of plate-like members may be curved with a predetermined curvature.

Each of the plurality of plate-like members may be inwardly curved into the interior of the casing of the information processing apparatus.

At least one of the plurality of plate-like members may be arranged to be slidable.

In accordance with embodiments of the present invention, the plurality plate-like members, each member having a plurality of perforations opened at predetermined intervals therebetween, each perforation having a predetermined size and shape, run in parallel and are arranged with one behind another and the entire or part of frontmost one of the plate-like member serves as the entire or part of front of the casing of the information processing apparatus.

The aperture ratio of the front side of the information processing apparatus is thus increased without lowering the design value of the front side.

BRIEF DESCRIPTION OF THE DRAWINGS

FIG. 19 illustrates an amount of encoded data accumulated in a read-enabled fashion on a buffer in the information processing apparatus in accordance with one embodiment of the present invention;

DESCRIPTION OF THE PREFERRED EMBODIMENTS

Figure 1:
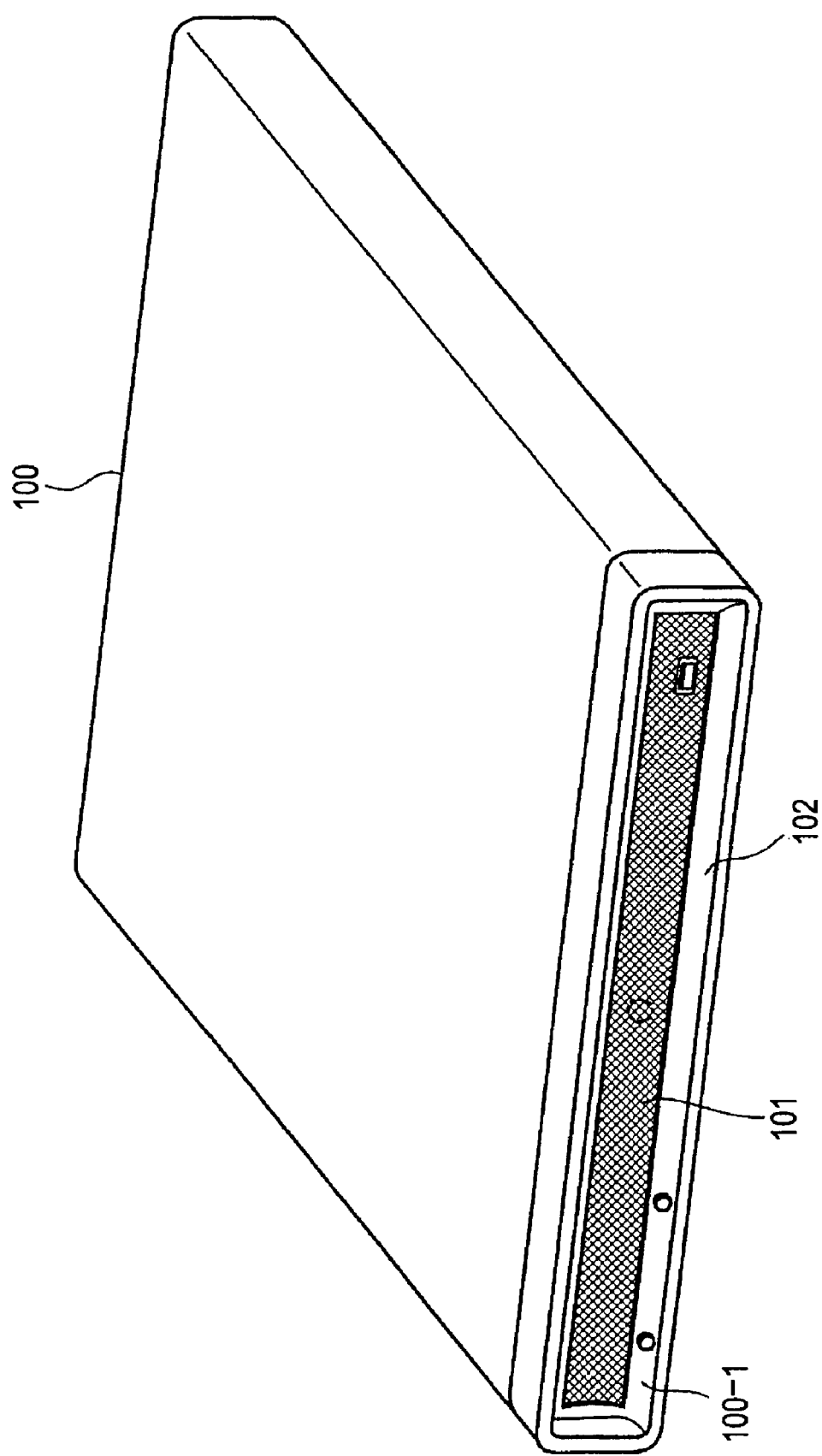
FIG. 1 is a perspective view illustrating a workstation in accordance with one embodiment of the present invention.

FIG. 1 is a perspective view of a workstation 100 of one embodiment of the present invention.

The workstation 100 is a computer higher in performance than low-end personal computers and performs a high-throughput process such as a three-dimensional rendering process on audio visual (AV) data at a high speed.

As shown in FIG. 1, the casing of the workstation 100 is a flattened rectangular parallelepiped having top and bottom surfaces much broader than other surfaces. A front side 100-1 of the workstation 100 facing the user in a normal use position thereof has a laterally elongated, generally rectangular shape.

The front side 100-1 includes a plate-like perforated panel 101 having a large number of perforations on the entire front area thereof and an outline member surrounding the perforated panel 101.

The entire perforated panel 101 functions as air intake vents. As will be described later, an electric fan in the workstation 100 forces air, heated by a heat generator within the casing of the workstation 100, through a discharge vent arranged on a rear side of the casing. With pressure dropped due to discharged area, cool air outside the casing flows into the casing through the perforated panel 101. The internal air in the casing is thus ventilated.

The workstation 100 performs a large amount of calculation to process AV data. The workstation 100 thus includes a central processing unit (CPU) and a graphics processing unit (GP), each operating at a high-frequency clock and generating a lot of heat. A memory having a large memory capacity is also used to perform a calculation process. The workstation 100 thus includes a large-capacity semiconductor memory operating at high speed. Since the amount of task is large, large workload is imposed on other elements such as bus and controllers. Workload shouldered by a system incorporated in the workstation 100 is large, and high power is consumed, causing a large amount of heat. The heat dissipation from the casing needs to be efficiently performed. Air heated in the casing needs to be discharged to the outside and cool air needs to be taken in from the outside.

The workstation 100 has a discharge vent on the rear panel of the casing and a large air intake vent is arranged on the front side 100-1. The air intake vent is defined by the perforated panel 101 having numerous perforations. The aperture ratio of the front side 100-1 is thus increased while exposure of circuitry and components within the casing to the user's view is restricted. Any drop in design value of the front side of the casing is thus controlled.

The casing of the workstation 100 is made of a metal such as aluminum or steel. The casing of the workstation 100 may be also made of a plastic. The casing is basically black or nearly black. An LED and printed characters are painted with any color other than black.

Figure 2:
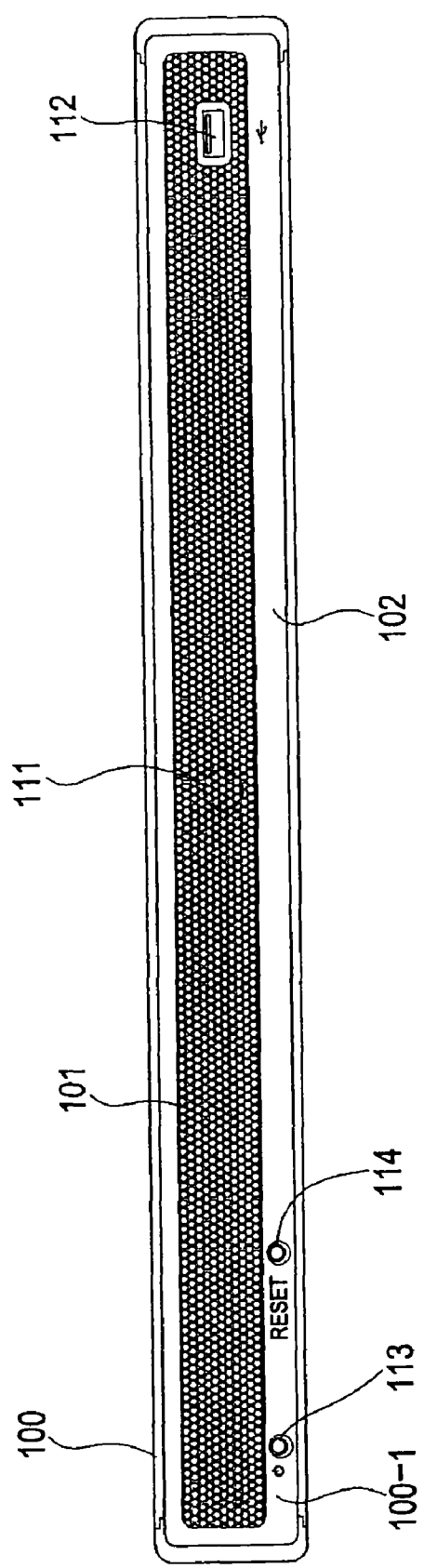
FIG. 2 is a front view of a casing of the workstation of in accordance with one embodiment of the present invention.
Figure 3:
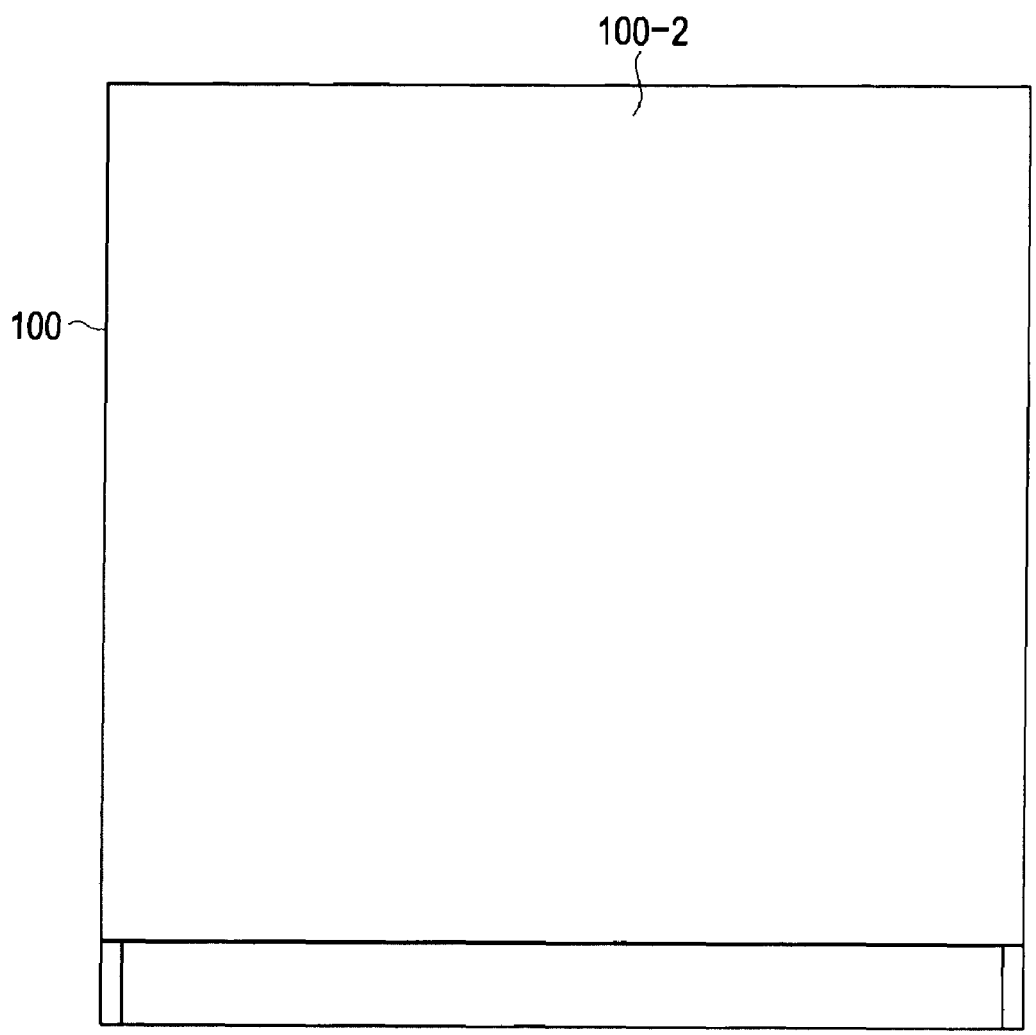
FIG. 3 is a top view of the casing of the workstation in accordance with one embodiment of the present invention.
Figure 4:
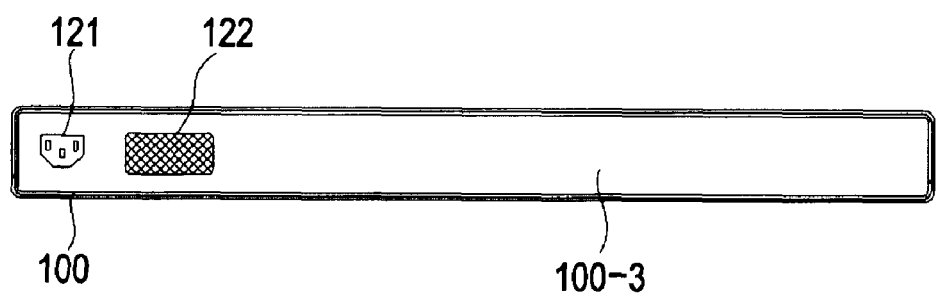
FIG. 4 is a rear view of the casing of the workstation in accordance with one embodiment of the present invention.
Figure 5:
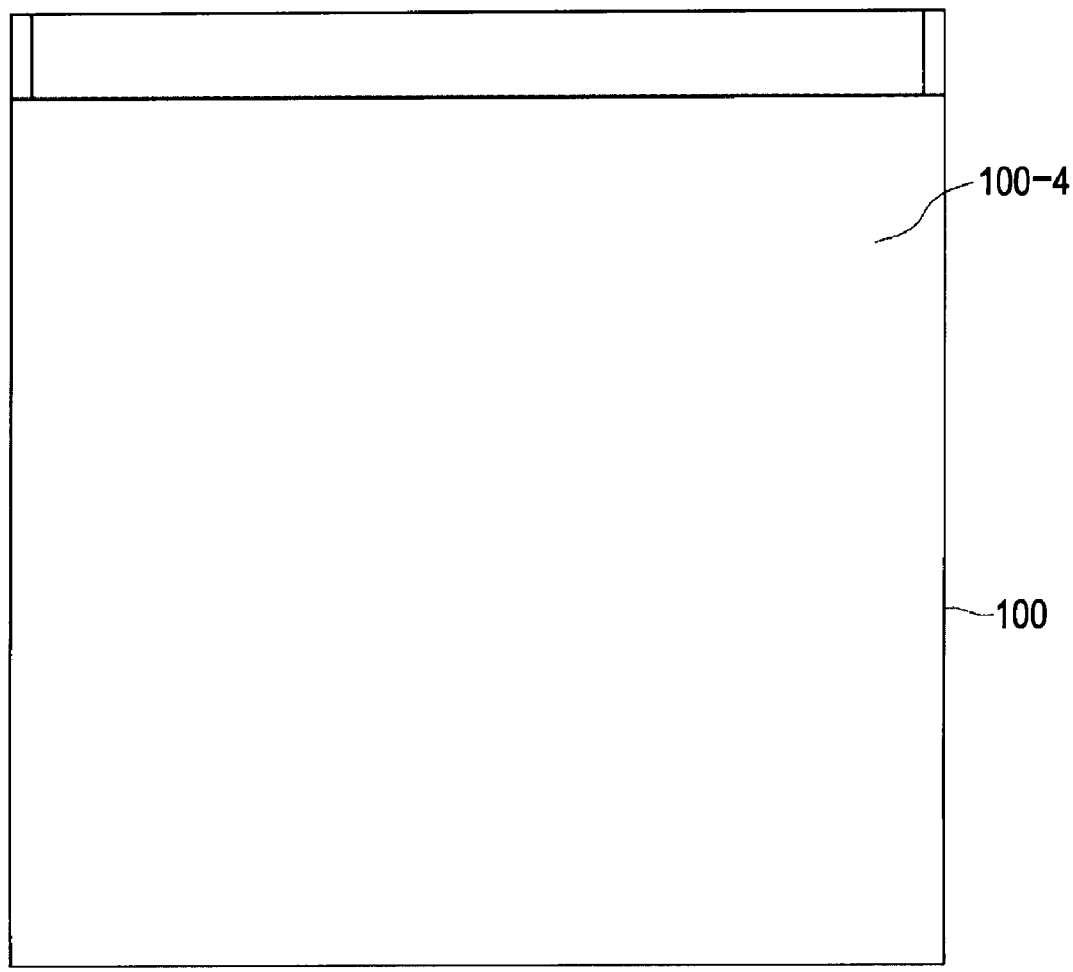
FIG. 5 is a bottom view of the casing of the workstation in accordance with one embodiment of the present invention.
Figure 6:
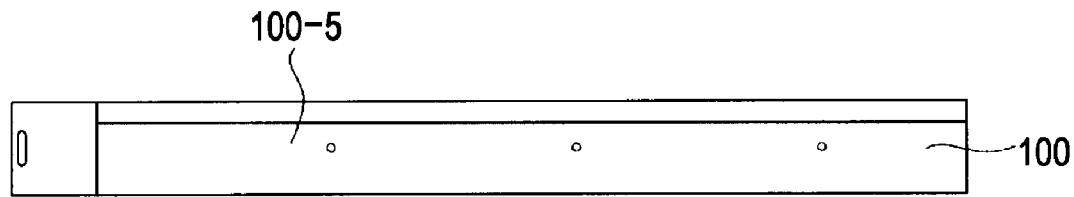
FIG. 6 is a right end view of the casing of the information processing apparatus in accordance with one embodiment of the present invention.
Figure 7:
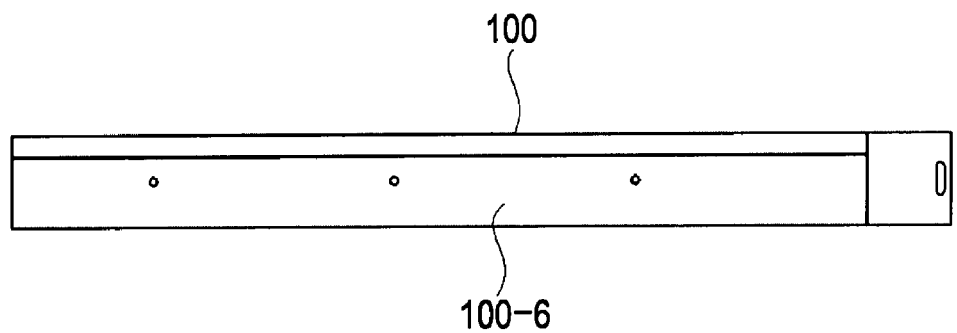
FIG. 7 is a left end view of the casing of the information processing apparatus in accordance with one embodiment of the present invention.

The workstation 100 is described below with reference to FIGS. 2 through 7. FIGS. 2-7 are views of the workstation 100 of FIG. 1 viewed at a variety of angles. FIG. 2 is a front view of the workstation 100 with the front side 100-1 viewed from front. FIG. 3 is a top view of the workstation 100 with a top side 100-2 viewed from above. FIG. 4 is a rear view of the workstation 100 with a rear side 100-3 viewed from behind. FIG. 5 is a bottom view of the workstation 100 with a bottom side 100-4 viewed from below. FIG. 6 is a right end view of the workstation 100 with a right end side 100-5 viewed from side. FIG. 7 is a left end view of the workstation 100 with a left end side 100-6 viewed from side.

The front side 100-1 includes the perforated panel 101 and an outline member 102 as shown in FIG. 2. A light-emitting diode (LED) 111 is arranged inside the perforated panel 101 at the approximate center thereof. A universal serial bus (USB) terminal 112 is arranged on the perforated panel 101 on the right portion of the front side 100-1. Arranged on the left lower portion of the perforated panel 101 on the outline member 102 are a power source LED 113 and a reset switch 114. The power source LED 113 flashes when power is on and is extinguished when power is off. The reset switch 114 is an user interface that is used to force the workstation 100 to resume operation.

As previously discussed with reference to FIG. 1, the perforated panel 101 serves as an air intake vent. In other words, most of the front side 100-1 becomes air intake vents. The workstation 100 provides a high aperture ratio (60%, for example) while preventing the circuitry and the components within the casing from being exposed to outside.

As will be described later, two perforated panels 101 are arranged. The center LED is arranged deeper inside than the two perforated panels 101. Since the perforated panel 101 is black, the center LED does not visibly stand out in the extinguished state thereof. The center LED in the lighting state thereof visibly stands out because light from the center LED is seen through the perforations with the black perforated panel 101 serving as a background.

As shown in FIG. 4, a power terminal 121 is arranged on the rear side 100-3 and a discharge vent mesh 122 is arranged close to the power terminal 121. An electric fan is mounted on the inner side of the discharge vent mesh 122 and discharges air from within the casing to outside the casing through the discharge vent mesh 122. The power terminal 121 receives a power cable supplying power to the system. A power source unit including an AC-to-DC converter is arranged within the casing on the inside of the power terminal 121. The power source unit is one of heat generators emitting a large amount of heat in the system of the workstation 100. The discharge vent is arranged close to the power source unit to cause air heated in the vicinity of the power source unit to be discharged to the outside.

In practice, terminals for data inputting and outputting, a network interface, etc. are further arranged on the rear side 100-3. For simplicity of explanation, those components are not shown.

FIGS. 8 through 11 are cross-sectional views of the workstation 100 taken along fore-aft lines (in parallel with the right end side 100-5) and viewed from the side of the right end side 100-5 of the workstation 100.

Figure 8:
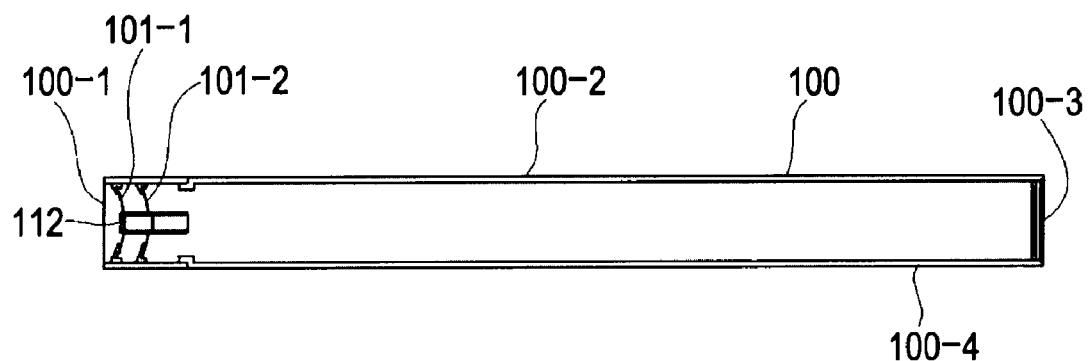
FIG. 8 is a cross-sectional view taken along a position of a universal serial bus (USB) terminal in the information processing apparatus in accordance with one embodiment of the present invention.
Figure 9:
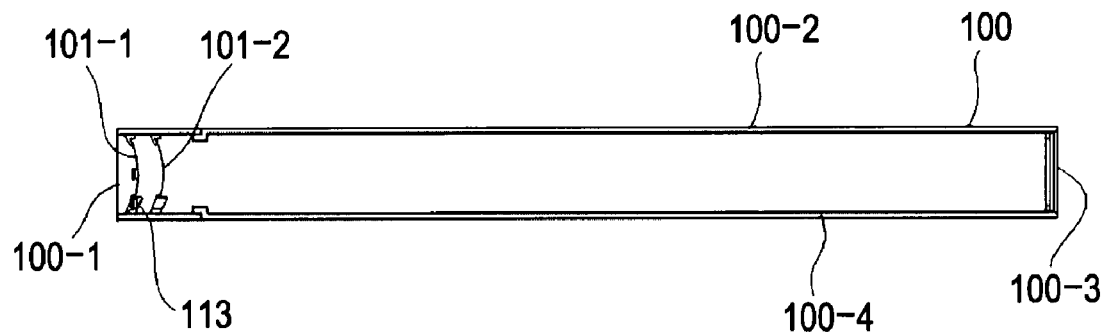
FIG. 9 is a cross-sectional view taken along a position of a power source LED in the information processing apparatus in accordance with one embodiment of the present invention.
Figure 11:
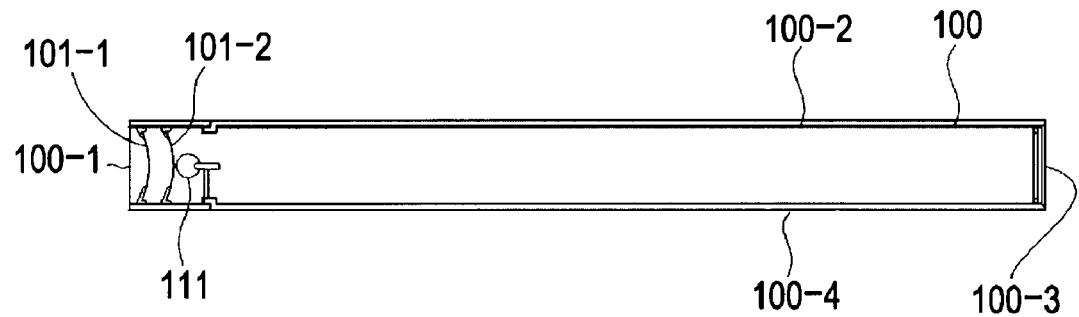
FIG. 11 is a cross-sectional view taken along a position of a center light-emitting diode (LED) in the information processing apparatus in accordance with one embodiment of the present invention.

FIG. 8 is a cross-sectional view taken along at a position of a universal serial bus (USB) terminal 112. FIG. 9 is a cross-sectional view taken along at a position of a power source LED 113. FIG. 11 is a cross-sectional view taken along a position of the center LED 111.

As shown in FIGS. 8 through 11, the two perforated panels 101 are arranged with one behind the other. As shown in FIG. 8 if viewed from the front side 100-1, an external one of the perforated panels 101 is referred to as a perforated panel 101-1 and an internal one of the perforated panels 101 is referred to as a perforated panel 101-2. If there is no need for discriminating between the two perforated panels 101, each of the perforated panel 101-1 and the perforated panel 101-2 is simply referred to as a perforated panel 101.

With reference to FIGS. 8 through 11, the perforated panel 101 is curved in a vertical cross-section so that a center portion of the perforated panel 101 is protruded inwardly into the casing of the workstation 100. If viewed from the front side 100-1, the horizontally center portion of the perforated panel 101 is recessed in a vertical cross-section. As shown in FIG. 8 through 11, a predetermined spacing is allowed between the perforated panel 101-1 and the perforated panel 101-2.

With reference to FIG. 8, the USB terminal 112 is arranged to pass through both the perforated panel 101-1 and the perforated panel 101-2. The perforated panel 101-1 and the perforated panel 101-2 have holes through which the USB terminal 112 is received.

As shown in FIG. 9, the power source LED 113 is arranged on the periphery of the perforated panel 101-1 and within the outline member 102. Wiring (not shown) of the power source LED 113 to the system in the casing is routed through the outline member 102.

Figure 10:
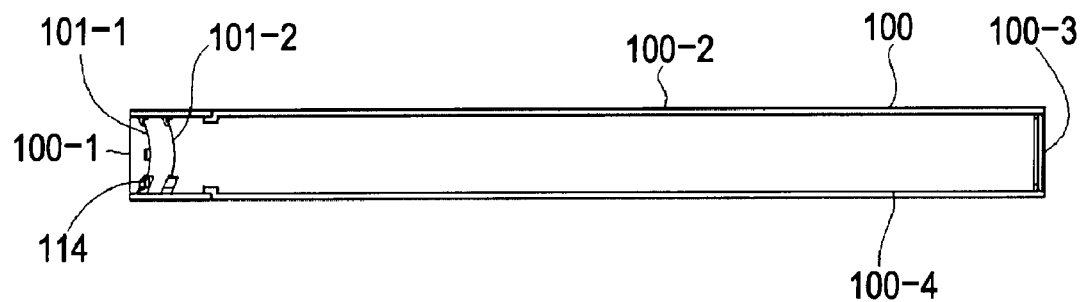
FIG. 10 is a cross-sectional view taken along a position of a reset switch in the information processing apparatus in accordance with one embodiment of the present invention.

As shown in FIG. 10, the reset switch 114 is arranged on the periphery of the perforated panel 101-1 and within the outline member 102. Wiring (not shown) of the reset switch 114 to the system in the casing is routed through the outline member 102.

As shown in FIG. 11, the center LED 111 is arranged inside the two perforated panels 101 in the casing. The center LED 111 includes a plurality LED's emitting light in different colors covered with a generally spherically shaped cover and operates as a single light emitting body.

Figure 12:
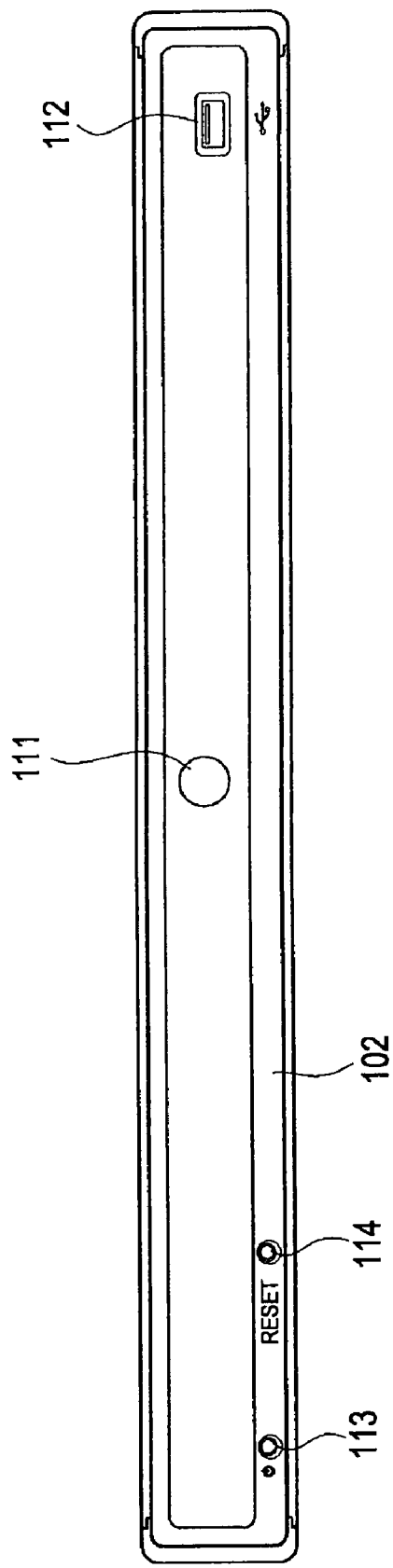
FIG. 12 is a front view of the casing of the information processing apparatus with a perforated panel thereof removed in accordance with one embodiment of the present invention.

FIG. 12 is a front view of the workstation 100 with the perforated panel 101 removed from the front side 100-1. The perforated panel 101 is affixed to the outline member 102 and can be separated from the outline member 102, the center LED 111, the USB terminal 112, the power source LED 113, the reset switch 114 and the like. The perforated panel 101 is manufactured separately from the outline member 102, the center LED 111, the USB terminal 112, the power source LED 113, the reset switch 114 and the like.

A structure of the perforated panel 101 is described below.

Figure 13:
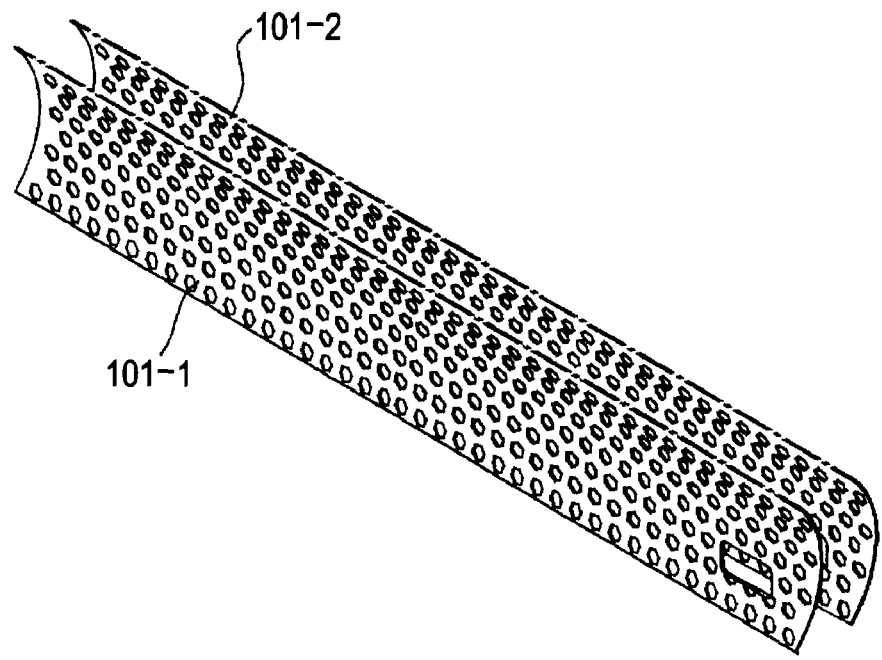
FIG. 13 is a perspective view of the perforated panel in the information processing apparatus in accordance with one embodiment of the present invention.

FIG. 13 is a perspective view of the perforated panel 101.

As shown in FIG. 13, the perforated panel 101-1 and the perforated panel 101-2 are arranged with one behind the other in a fore-after direction with a predetermined spacing kept therebetween. Mechanical robustness of the casing is thus stronger than when only one perforated panel 101 is used. The use of two perforated panels 101 provides more visible obstacle and the interior of the casing (deeper than the two perforated panels 101) is exposed less to the vision of the user from outside the front side 100-1 without reducing the aperture ratio. The use of two perforated panels 101 provides more physical obstacle that controls more entry of dust during air intake and reduces sound level of noise caused by the electric fan, etc.

Since a predetermined spacing permitted kept between the perforated panel 101-1 and the perforated panel 101-2 allows the user to feel depth of the casing, the center LED 111 seen through the two perforated panels 101 looks solidier.

As shown in FIG. 13, each of the perforated panel 101-1 and the perforated panel 101-2 is curved in an inwardly concave shape into the casing. The perforated panel 101-1 and perforated panel 101-2 are equal in curvature.

With each perforated panel 101 curved in an inwardly concave shape in vertical cross section, the casing of the workstation 100 is mechanically reinforced. Each perforated panel 101 curved in an inwardly concave shape in vertical cross section reduces more the possibility that the perforated panel 101 is touched by something such as a finger of the user than each perforated panel 101 curved in an outward concave shape. More specifically, such an arrangement reduces the possibility that the perforated panel 101 happens to be damaged or deformed.

If an excessive force is applied onto a convex surface, the convex surface may be dented at a point of force application. Such a dent may stand out. If an excessive force is applied onto a concave surface, the convex surface may be dented in the same direction as the originally convex direction and the resulting deform may be less noticeable. Since the deformed point is caused on the originally recessed area of the concave surface, the deformed point is thus less noticeable. Even if a deformation takes place, that deformation is less noticeable on the perforated panel 101 curved in an inwardly concave shape than on a perforated panel 101 curved in a convex shape if viewed from outside.

The perforated panel 101 curved in an inwardly concave shape along a generally horizontally running center line allows part of light emitted from the center LED 111 passing through perforations to be reflected on the perforated panel 101. As will be described later, the light of the center LED 111 looks diffused.

The perforations of the perforated panel 101-1 and perforated panel 101-2 are identical in shape. One perforation in the perforated panel 101-1 is identical in shape and size to and aligned in position to the corresponding perforation in the perforated panel 101-2. Since the perforations in the perforated panel 101-1 are generally aligned in fore-aft direction with the corresponding perforations in the perforated panel 101-2, air flowing through the perforations is not disturbed.

Figure 14:
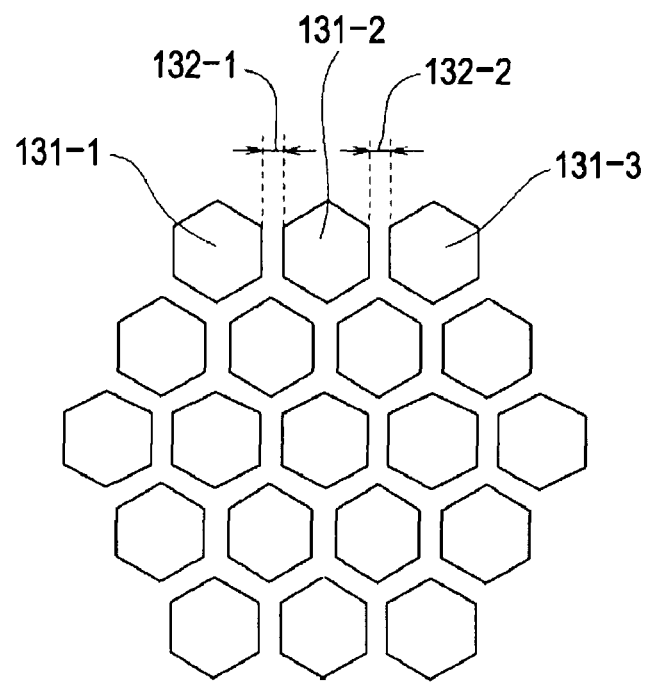
FIG. 14 illustrates a structure of each perforation in the perforated panel in the information processing apparatus in accordance with one embodiment of the present invention.

FIG. 14 illustrates the structure of each perforation opened in the perforated panel 101. FIG. 14 illustrates only some of the perforations of the perforated panel 101.

As shown in FIG. 14, perforations 131-1 through 131-3 substantially identical in size and shape (generally hexagonal shape) are opened on the perforated panel 101 in parallel with perforations 132-1 and 132-2, for example, with equal spacing permitted between one side of one perforation and an adjacent side of an adjacent perforation. A honeycomb structure thus results. Perforations are opened on the entire perforated panel 101.

By making each perforation generally hexagonal, the spacings between adjacent perforations become equal to each other. The hexagonal perforations provide a larger aperture ratio than the perforations in other shapes. There is no place where the spacing between the perforations is extremely narrow. Given the same aperture ratio, the perforated panel 101 becomes mechanically stronger with the honeycomb structure than a structure in any other shape. Since the honeycomb structure features less localized robustness variation, generally uniform robustness is provided on the entire perforated panel 101.

When the perforated panel 101 is manufactured, two flat panels equal in size to the perforated panel 101 are produced first to open the perforations on the panels 101-1 and 102-1. A plurality of generally hexagonal perforations are punched in the corresponding positions on the two panels to form the honeycomb structure. The perforations may be punched with the two panels stacked with one on top of the other. After punching the perforations, the perforated panels are then curved at a predetermined curvature to produce the perforated panel 101-1 and the perforated panel 101-2 as shown in FIG. 13. Holes for receiving the USB terminal 112 are opened in a later machining process.

Figure 15:
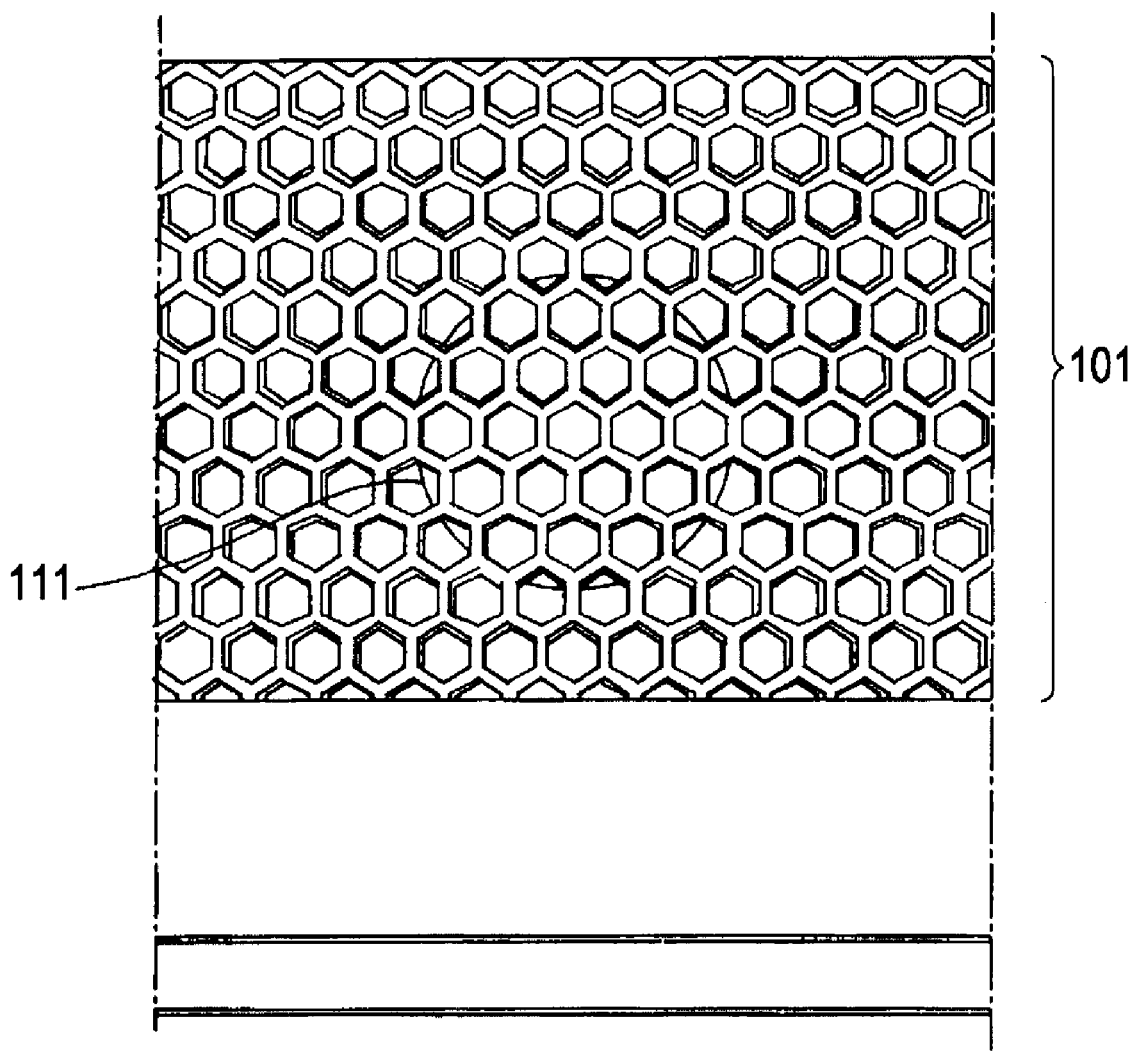
FIG. 15 is an expanded view of a portion of the perforated panel close to the center LED in the information processing apparatus in accordance with one embodiment of the present invention.

Perforation alignment in the dual structure of the perforated panels 101 is described below. FIG. 15 is an expanded view of a portion of the front side 100-1 close to the center LED 111 with the front side 100-1 viewed in front.

If the front side 100-1 is viewed in front as shown in FIG. 15 (in perpendicular to the front side 100-1), the perforations of the perforated panel 101-1 are approximately aligned with the corresponding perforations of the perforated panel 101-2. Perforations in and in the vicinity of the center LED 111 look generally hexagonal.

If a point of view of the user is shifted to left or right portions of the perforated panel 101, in other words, if the perforations are viewed at a slant angle, the position of a perforation in the perforated panel 101-1 and the position of a corresponding perforation in the perforated panel 101-2 may be shifted from each other. This is because the predetermined spacing is maintained between the perforated panel 101-1 and the perforated panel 101-2. The predetermined spacing between the two panels 101 is large in comparison with the size of each perforation, and if the perforations are viewed at a slant angle rather than at a vertical angle with respect to the perforated panel 101, the corresponding perforations are not correctly aligned. The area where the corresponding perforations overlap, namely, the area through which the inside portion deeper than the two perforated panels 101 (see-through portion of the perforations) is reduced. By arranging the two perforated panels 101, the area through which the inside portion deeper than the two perforated panels 101 is seen from outside the casing of the front side 100-1 becomes extremely smaller in comparison with the aperture ratio. The interior of the casing becomes difficult to see through when the two perforated panels 101 are used than when one perforated panel 101 is used.

The displacement of the perforations causes a so-called moiré pattern, thereby allowing the perforated panel 101 to stand out. The interior of the casing is relatively difficult to see through (the interior of the casing is visually blocked).

Even if the user attempts to see through the perforations of the perforated panel 101-1 with the two perforated panels 101 employed, the user's eyes tend to focus on the second perforated panel 101-2. The user has difficulty seeing through the second perforated panel 101-2 (with the interior of the casing blocked in the view of the user).

The interior of the casing is visually hidden without reducing the aperture ratio when the two perforated panels 101 are used more than when a single perforated panel 101 is used. Since the perforations opened in the perforated panel 101-1 and the corresponding perforations opened in the perforated panel 101-2 are aligned in position, the flow of air is not impeded even with the two perforated panels 101 used.

When the two perforated panels 101 are used, the shape of each perforation changes depending on an viewing angle to the perforated panel 101. The appearance of the center LED 111 also changes depending on the viewing angle.

Figure 16:
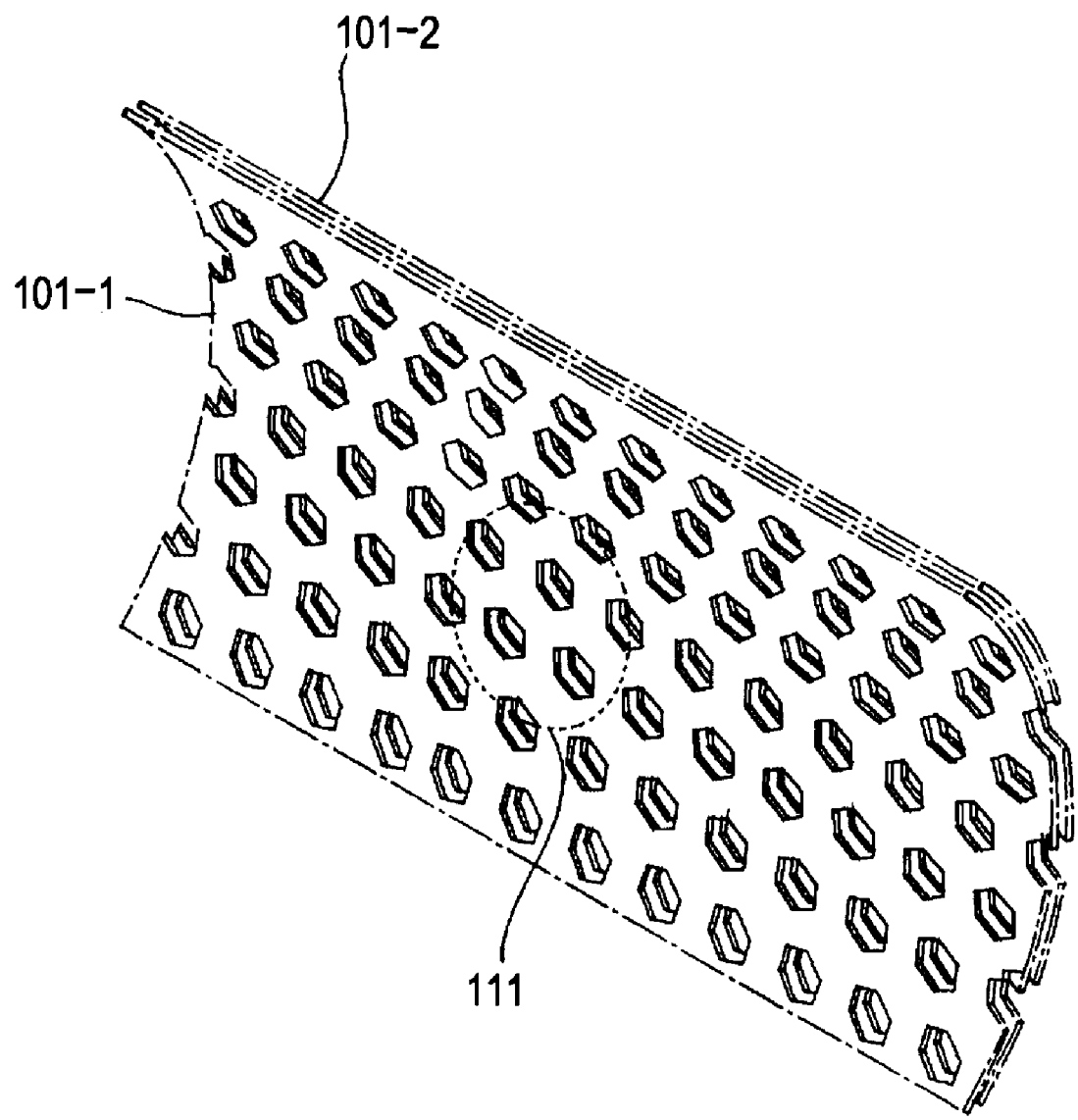
FIG. 16 is an expanded view of a portion of the perforated panel close to the center LED in the information processing apparatus in accordance with one embodiment of the present invention.

FIG. 16 illustrates the perforations when the front side 100-1 is viewed at a slant angle with respect thereto. FIG. 16 is an expanded view of the front side 100-1 in the vicinity of the center LED 111. The shape of the penetration space of the perforations is different from that of FIG. 15. Since the shape of the penetration space of the perforations with respect to the center LED 111 is different from that of FIG. 15, the center LED 111 looks different between FIG. 15 and FIG. 16.

More specifically, the center LED 111 looks different depending on a viewing angle (position) of the user to the front side 100-1 of the casing of the workstation 100. If the user views the front side 100-1 of the workstation 100 while moving laterally across in front of the workstation 100, the appearance of the center LED 111 varies. As a result, light of the center LED 111 looks fluctuating.

Figure 17A:
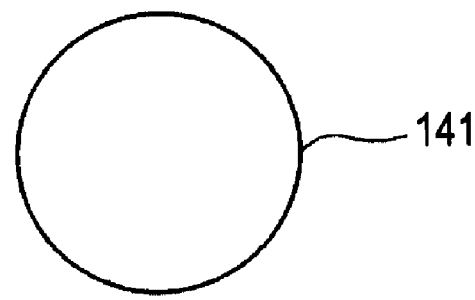
FIGS. 17A-17C illustrate the center LED that emits light.

Since the center LED 111 is covered with a generally spherical cover, light emitted by the center LED 111 appears as a circle 141 as shown in FIG. 17A.

Figure 17B:
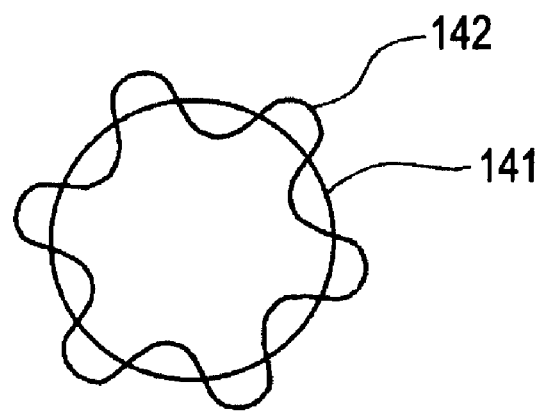

The two perforated panels 101 are arranged in front of the center LED 111. If the center LED 111 is seen through the two perforated panels 101, an outline of a light beam from the center LED 111 is deformed as represented by an asteroid shape 142 as shown in FIG. 17B. When the user views the front side 100-1 of the workstation 100 while moving laterally across in front of the workstation 100, the outline of the light beam of the center LED 111 further changes from the asteroid shape 142 as the penetration space of the perforations changes. The workstation 100 gives the visual impression that the light beam of the center LED 111 fluctuates.

Figure 17C:
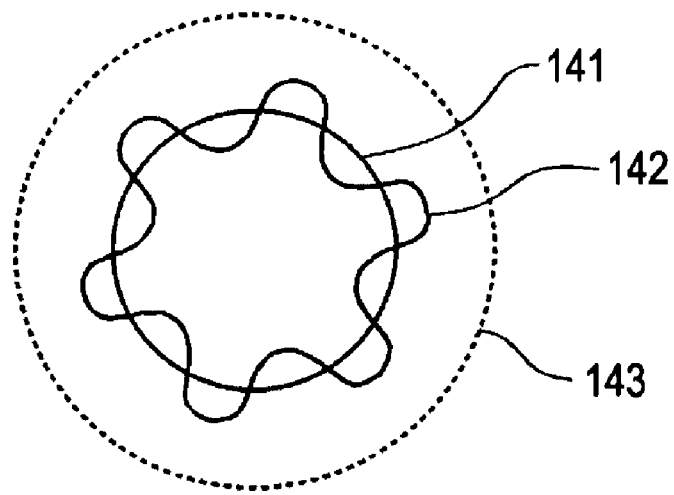

Since the perforated panel 101 is inwardly curved in a convex form into the casing, part of the light beam of the center LED 111 passing through the perforations is reflected from the perforated panel 101. As shown in FIG. 17C, the periphery of the center LED 111 dimly shines as represented by a broken line circle 143. The workstation 100 thus gives an optical illusion effect to the user.

When the workstation 100 normally operates, the center LED 111 lights in blue color. The front side 100-1 is generally black and the perforated panel 101 and the outline member 102 surrounding the perforated panel 101 form a generally rectangular configuration. With the generally spherical center LED 111 lighting in blue, the entire front side 100-1 provides a design that looks as if the front side 100-1 is composed of biological cells. More specifically, the perforated panel 101 may be associated with the cellular cytoplasm, the outline member 102 may be associated with the cell wall, and the center LED 111 may be associated with the cell nucleus.

When the user looking at the front side 100-1 moves across in front of the workstation 100, the outline of the light beam of the center LED 111 associated with the cell nucleus and the shape of the light beam reflected from the perforated panel 101 fluctuate. The user may have a visual illusion that the front side 100-1 is a living matter.

The front side 100-1 of the casing of the workstation 100 provides an aesthetically high standard of design. Without compromising design value, the interior of the casing is hidden more from the view field of the user than when a single perforated panel 101 is used.

Only the use of the above-described design causes the light beam of the center LED 111 in the workstation 100 to look different in appearance. More specifically, this design is free from controlling the light emission of the center LED 111 and any increase in workload otherwise involved in control of the center LED 111.

FIG. 8 illustrates an installation example of the workstations 100 of FIG. 1.

Figure 18:
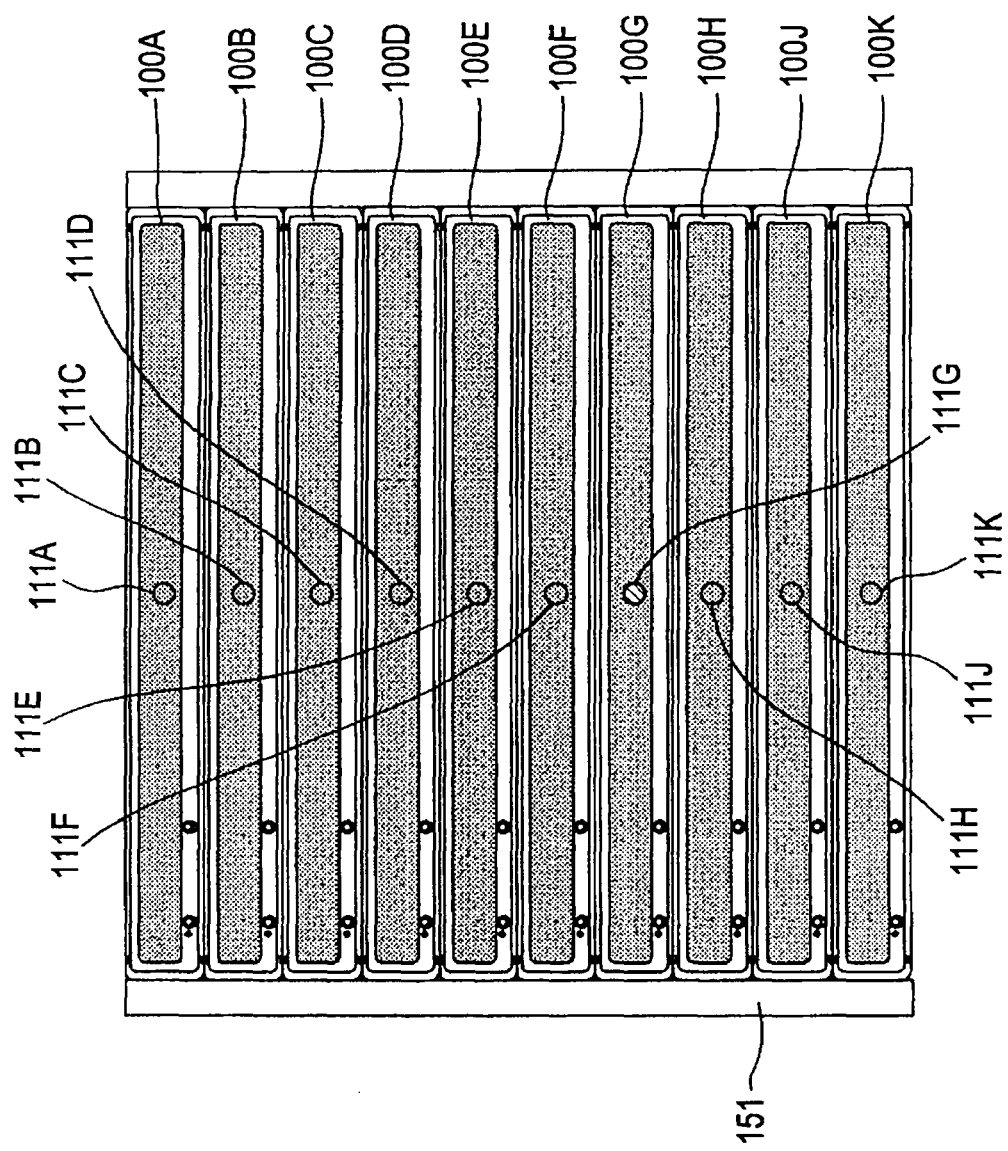
FIG. 18 illustrates a installed workstation as the information processing apparatus in accordance with one embodiment of the present invention.

As shown in FIG. 18, a plurality of workstations 100 are used in a group mode with one set linked to another more often than in an isolated mode in which only a single workstation 100 is used independently. As shown in FIG. 18, the plurality of workstations 100 (workstation 100A through 100K) are stacked with one on top of another in a rack 151. Some or all of the workstation 100A through 100K may operate independently of each other. Alternatively, some or all of the workstation 100A through 100K may operate in cooperation with each other in order to perform AV data processing, such as three-dimensional rendering process, typically requiring high throughput performance.

As shown in FIG. 18, the front sides 100-1 of the workstations 100 are arranged on the front of the system. The front sides 100-1 of the workstations 100, associated with the biological cell, are stacked with one on top of another. A set of all workstations 100 provides a design that is thus associated with a single living matter. This design also suggests a mutual cooperation among the workstations 100.

The workstation 100 takes air through the front side 100-1. Even if the workstations 100 are stacked, high air ventilation performance is achieved.

The operational statuses of the workstations 100 are indicated by the emission light color and blinking of the light beam of the center LEDs 111 on the workstations 100 (center LEDs 111A through 111K).

For example, if power of the workstation 100 is interrupted, the center LED 111 is extinguished. When the workstation 100 is in a normal operating condition, the center LED 111 lights in blue. When the workstation 100 malfunctions, the center LED 111 lights in red.

The center LED 111 thus notifies the user of the status of the workstation 100 in such a simple status indication. Even if plurality of workstations 100 are stacked as shown in FIG. 18, the user can easily identify any malfunctioning workstation 100.

The center LED 111 may emit light in a periodical pattern (such as a blinking pattern) in order to convey, to the user, status information in a more pronounced fashion or a variety of types of information.

FIG. 19 is a block diagram of the workstation 100. As shown in FIG. 19, the workstation 100 of FIG. 1 includes a microprocessor 201, an extreme data rate (XDR) random access memory (RAM) 203, a southbridge 204, a hard disk drive (HDD) 205 and a USB interface 206.

The microprocessor 201 is connected to the XDR-RAM 203 via a bus 212. The microprocessor 201 is further connected to the southbridge 204. Also connected to the southbridge 204 are the HDD 205, the USB interface 206 and an LED controller 260 controlling the center LED 111.

Further connected to the southbridge 204 are a network interface 251 and a drive 252. The network interface 251 performs an interface process with a local area network (LAN) or another network such as the Internet via a peripheral components interconnect (PCI) bus 250. The drive 252 is loaded with a removable medium 353 such as a compact disk (CD), a digital versatile disk (DVD), a Mini-disk (MD), or a flash memory.

The microprocessor 201 is in a single-chip multi-core structure and runs at an operating frequency of 4 GHz. The microprocessor 201 includes a main CPU core 241, signal processing processors (hereinafter referred to as sub CPU cores) 242-1 through 242-8, a memory controller 243 and an input/output (I/O) controller 244. The general-purpose main CPU core 241 executes basic programs such as an operating system. The sub CPU cores 242-1 through 242-8 are reduced instruction set computer (RISC) type processors connected to the main CPU core 241 via an internal bus 245. The memory controller 243 controls the XDR-RAM 203 having a memory capacity of 256 Mbytes. The I/O controller 244 manages inputting and outputting of data with the southbridge 204.

The microprocessor 201 performs the three-dimensional rendering process on the AV data, for example, and supplies process results to the HDD 205 via the southbridge 204.

The microprocessor 201 also extracts a variety of parameters generated in the middle of each process thereof or extracts the parameters from the original AV data.

The eight sub CPU cores 242-1 through 242-8 in the microprocessor 201 have respective roles in the three-dimensional rendering process, thereby encoding in parallel the processes thereof.

The microprocessor 201 is thus designed so that the sub CPU cores 242-1 through 242-8 perform concurrently the AV data processing in parallel.

The main CPU core 241 performs a management process and the processes other than the processes performed by the sub CPU cores 242-1 through 242-8. Via the southbridge 204, the main CPU core 241 exchanges data with the HDD 205, the USB interface 206, the network interface 251 and the removable medium 253 loaded on the drive 252.

At the startup of the workstation 100, the microprocessor 201 reads an application program stored on the HDD 205 in accordance with a control program stored on the HDD 205 and then expands the application program onto the XDR-RAM 203. The microprocessor 201 performs control programs as necessary in accordance with the application program and a user operation input.

The southbridge 204 is also connected to the LED controller 260 controlling the operation of the center LED 111. The microprocessor 201 controls the LED controller 260 via the southbridge 204, thereby causing the center LED 111 to emit light.

Since the microprocessor 201 including a number of CPU cores operates at high speed, consumed power is large causing a large amount of generated heat. As previously discussed, the heat generator needs to be efficiently cooled. A number of heat generators generating a large amount of heat is arranged in the entire casing of the workstation 100. Such heat generators include the microprocessor 201, the XDR- RAM 203, the HDD 205, the network interface 251 and the drive 252. The entire interior of the casing needs to be air ventilated efficiently.

The workstation 100 of one embodiment of the present invention with the frontal structure thereof provides a high aperture ratio while maintaining the design value of the front of the casing.

The perforations opened in the perforated panel 101-1 and the corresponding perforations opened in the perforated panel 101-2 may be set to be different in position and size. The perforated panel 101-1 and the perforated panel 101-2 may be set to be different in color. With different colors used, the moiré pattern may be changed. The moiré pattern may be changed to a predetermined intended pattern. The aperture ratio may be changed or dust collection performance may be controlled.

If the size and position of the perforations opened in the perforated panel 101-2 behind the perforated panel 101-1 are controlled with the design of the perforated panel 101-1 unchanged, the aperture ratio can be adjusted with the appearance of the front side 100-1 remains unchanged.

When an internal system structure is modified along with a version updating of the workstation 100, heat discharge performance required also changes. The setting of the aperture of the front side 100-1 may also be changed. If the size and position of the perforations opened in the perforated panel 101-2 are controlled with the design of the perforated panel 101-1 unchanged, the aperture ratio optimum for the internal system is achieved without degrading the design value of the front side 100-1.

A plurality of workstations 100 are typically used in cooperation with each other as discussed with reference to FIG. 18. In such a case, workstations 100 of a plurality of versions can be mixed. If the design of the front side 100-1 changes, design consistency may be destroyed. In comparison with other workstations 100, a workstation 100 of a different version may stand out in appearance.

The aperture ratio can be adjusted in the workstation 100 while the design value of the front side 100-1 is maintained. Even in the case of FIG. 18, design consistency of the workstations 100 is thus maintained.

The perforations in the perforated panel 101-1 and the perforations in the perforated panel 101-2 may be dynamically changed in position.

FIG. 20 is a perspective view illustrating a workstation 300 having a frontal structure in accordance with one embodiment of the present invention.

The workstation 300 of FIG. 20 is substantially identical in structure and function to the workstation 100. A perforated panel 301-2 is laterally slidable to the left or right. A slot 311 is arranged on a front left portion of a top side 300-2 of the workstation 300. A lever 312 serving as an interface for sliding laterally the perforated panel 301-2 is exposed externally through the slot 311.

A width dimension 322 of the perforated panel 301-2 in the casing is shorter than a width dimension 321 of the perforated panel 301-1. The perforated panel 301-2 is laterally slidable in directions indicated by arrows 341 and 342 in parallel with the perforated panel 301-1.

By sliding the lever 312 projected externally out of the casing, the user can slide the perforated panel 301-2 laterally to shift the perforations.

The aperture and the air intake direction are thus dynamically adjusted. Appropriate settings are entered in accordance with ambient environments and purposes of use of the workstation 300.

The position of the lever 312 is optional. The lever 312 may be arranged on the bottom side, or the left or right side of the casing. As shown in FIG. 20, the lever 312 is a user interface. A variety of arrangements are possible. Any arrangement is acceptable as long as the perforated panel 301-2 is laterally slidable.

The user interface may not directly be connected to the perforated panel 301-2. A mechanism such as a belt or gear may be arranged between the user interface and the perforated panel 301-2. The user interface may be electrically controlled using an electric motor. A controller for electrical control may be arranged on the outline member 102 or a remote commander (not shown).

Figures 21A, 21B:
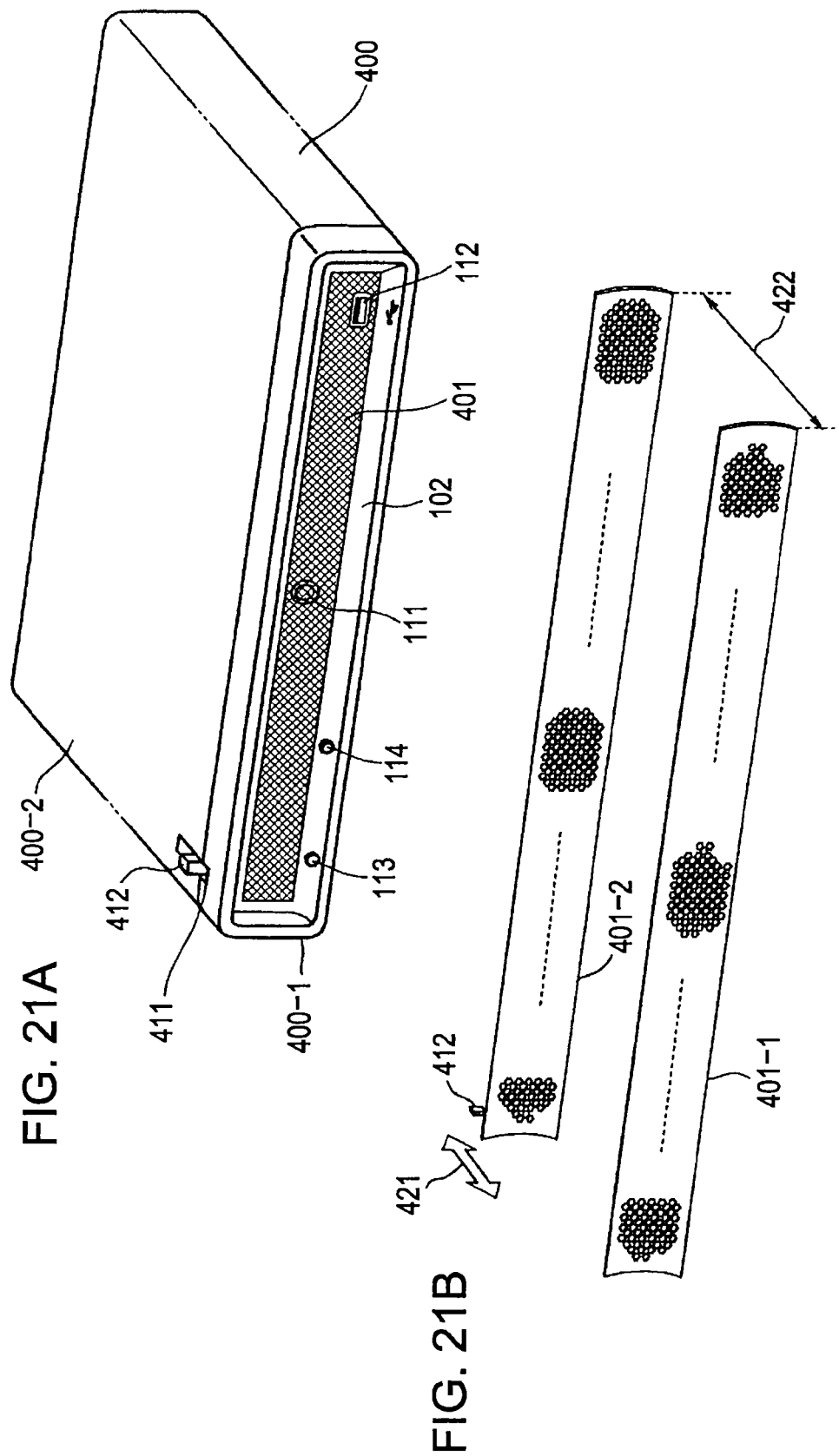
FIGS. 21A and 21B are perspective views illustrating yet another workstation having the frontal structure in accordance with one embodiment of the present invention.

The perforated panel may be slid in a fore-aft direction as well. FIG. 21 is a perspective view of a workstation 400 having a frontal structure in accordance with one embodiment of the present invention.

The workstation 400 of FIG. 21 is substantially identical in structure and function to the workstation 100. A perforated panel 401-2 is slidable in a fore-aft direction. A slit 411 is opened on a top front portion of a top side 400-2 of the workstation 400. To slide the perforated panel 401-2 in a fore-aft direction, a lever 412 serving as a user interface for sliding the perforated panel 401-2 is projected out of the casing of the workstation 400.

The perforated panel 401-2 on the inside and the perforated panel 401-1 on the front are approximately equal in width dimension. The perforated panel 401-2 is thus designed to be slidable in perpendicular to the perforated panel 401-1 (in directions represented an arrow 421). The spacing between the perforated panel 401-1 and the perforated panel 401-2 represented by an arrow 422 changes.

By sliding in a fore-aft direction the lever 412 projecting out of the casing, the user can slide the perforated panel 401-2 in a fore-aft direction. The spacing between the perforated panel 401-1 and the perforated panel 401-2 is thus varied.

The user can dynamically adjust the appearance (depth) of the center LED 111 and dust collection performance. Appropriate settings are entered in accordance with ambient environments and purposes of use of the workstation 400.

Figure 20A:
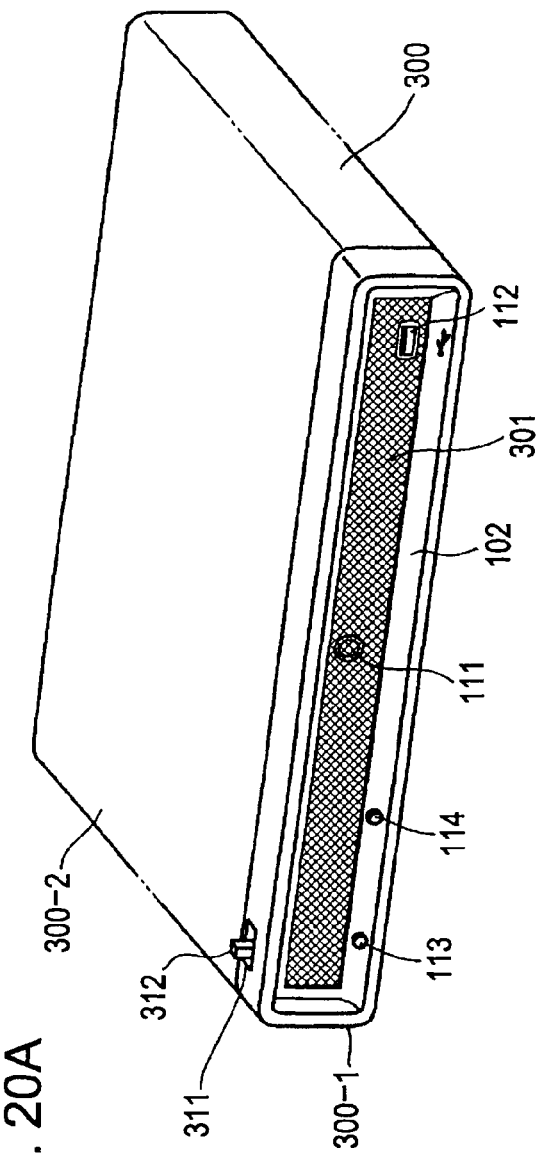
FIGS. 20A and 20B are perspective views illustrating another workstation having a frontal structure in accordance with one embodiment of the present invention.
Figure 20B:
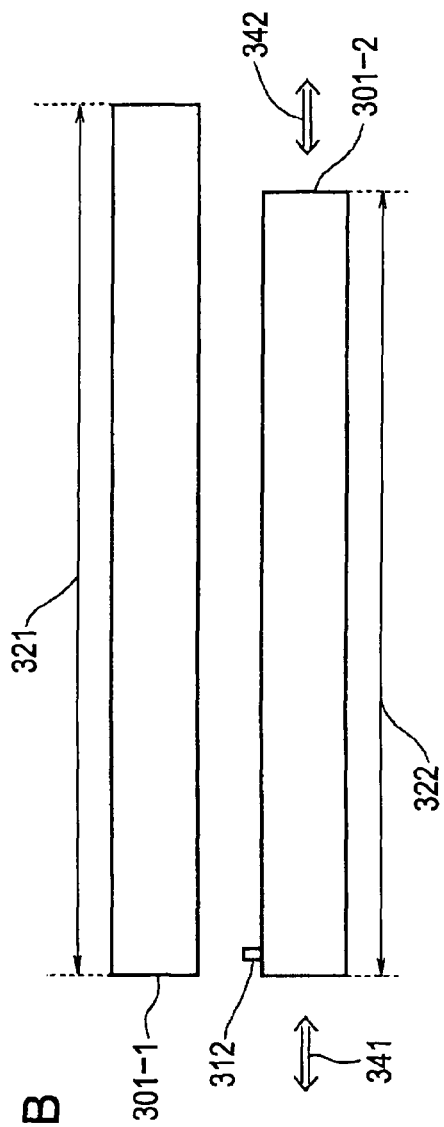

Any shape and any arrangement position of the lever 412 may be acceptable in the same manner as described with reference to FIGS. 20A and 20B.

The perforated panel 101-2 may be slid up/down directions, or in right/left directions, and fore-after directions. The front side perforated panel 101-1 may be set to be slidable instead of the perforated panel 101-2. Alternatively, both the perforated panel 101-1 and the perforated panel 101-2 may be set to be slidable.

The two perforated panels 101 are used in the above discussion. Alternatively, three or more perforated panels 101 may be used.

In the above discussion, the workstation 100 processes the AV data. The function and applications of the workstation 100 are not limited to any particular ones. Each element of the casing is not limited to any particular size. The drive may be arranged on the front side 100-1. Another input and output terminal may be used instead of the USB terminal 112.

The perforations opened in the perforated panel 101 are not limited to any particular shape, size, position and spacing dimension between the adjacent perforations. The shape of each perforation may be circular, triangular, square, star-shaped, or rhombic. Perforations different in size or shape may be mixed. A mesh member may be used instead of the perforated panel 101. The curvature of the perforated panel 101 is not limited to any particular curvature value.

The color and material of each member of the casing of the workstation 100 are not limited to any particular ones. The center LED 111 is not limited to any particular type. One of a fluorescent lamp and an incandescent lamp may be used instead of the center LED 111. A monitor displaying an image may be used instead of the center LED 111. The center LEDs 111 are not limited to any particular shape and any particular number.

The apparatus discussed above may be split into a plurality of apparatuses. Alternatively, the plurality of apparatuses discussed above may be integrated into a single apparatus. A mechanism other than those discussed above may be included in the above-described apparatus. If the mechanism and the operation of the system remains unchanged, part of one apparatus may be removed and then added to another apparatus.

It should be understood by those skilled in the art that various modifications, combinations, sub-combinations and alterations may occur depending on design requirements and other factors insofar as they are within the scope of the appended claims or the equivalents thereof.

What is claimed is:

1. A frontal structure of an information processing apparatus, comprising:
   a plurality of plate-like members, each member having a plurality of perforations opened at predetermined intervals therebetween, each perforation having a predetermined size and shape, the plate-like members running in parallel and arranged with one behind another and an entire or part of a frontmost one of the plate-like members serving as an entire or part of a front of a casing of the information processing apparatus, each of the plurality of plate-like members curved with a predetermined curvature to reinforce the information processing apparatus and to reduce an appearance of external surface damage.

2. The frontal structure according to claim 1, wherein each of the perforation serves as an air intake vent for taking air from outside the information processing apparatus into an interior of the casing of the information processing apparatus.

3. The frontal structure according to claim 1, wherein each of the perforations has a generally hexagonal shape in a manner such that the perforations form a honeycomb structure.

4. The frontal structure according to claim 1, wherein the plurality of plate-like members are arranged so that each perforation on one of the plate-like members is in alignment with a corresponding perforation on another of the plate-like member.

5. The frontal structure according to claim 1, wherein each of the plurality of plate-like members is inwardly curved into the interior of the casing of the information processing apparatus.

6. A frontal structure of an information processing apparatus, comprising:
   a plurality of plate-like members, each member having a plurality of perforations opened at predetermined intervals therebetween, each perforation having a predetermined size and shape, the plate-like members running in parallel and arranged with one behind another and an entire or part of a frontmost one of the plate-like members serving as an entire or part of a front of a casing of the information processing apparatus, at least one of the plurality of plate-like members arranged to be slidable.

7. The frontal structure according to claim 6, wherein a first plate-like member is slidable in a depth-wise direction of the information processing apparatus relative to a second plate-like member.

8. The frontal structure according to claim 6, wherein a first plate-like member is slidable in a width-wise direction of the information processing apparatus relative to a second plate-like member.

9. The frontal structure according to claim 6, wherein a first plate-like member is slidable in a vertical direction of the information processing apparatus relative to a second plate-like member.

10. The frontal structure according to claim 6, further comprising:
    a light-emitting unit for emitting light toward the plurality of plate-like members and for creating a moire pattern with the plurality of plate-like members to vary an appearance of the light-emitting unit based on an angle of viewing.

11. The frontal structure according to claim 1, further comprising:
    a light-emitting unit for emitting light toward the plurality of plate-like members and for creating a moire pattern with the plurality of plate-like members to vary an appearance of the light-emitting unit based on an angle of viewing.

* * * * *